United States Patent
Suh (10) Patent No.: US 6,198,650 B1
(45) Date of Patent: Mar. 6, 2001

(54) SEMICONDUCTOR MEMORY DEVICE AND DATA OUTPUT BUFFER THEREOF

(75) Inventor: Young-Ho Suh, Yongin (KR)

(73) Assignee: Samsung Electronics Co., Ltd, Suwon (KR)

( * ) Notice: Subject to any disclaimer, the term of this patent is extended or adjusted under 35 U.S.C. 154(b) by 0 days.

(21) Appl. No.: 09/587,644

(22) Filed: Jun. 5, 2000

(30) Foreign Application Priority Data

Jun. 3, 1999 (KR) .................................................. 99-20418

(51) Int. Cl.$^7$ ...................................................... G11C 5/06
(52) U.S. Cl. ................................ 365/63; 365/51; 365/78; 365/230.06
(58) Field of Search .................................... 365/63, 51, 78, 365/233, 236.6, 189.05, 189.08, 189.12

(56) References Cited

U.S. PATENT DOCUMENTS 5,887,272 * 3/1999 Sartore et al. ........................ 711/105
5,953,278 * 9/1999 McAdams et al. ................... 365/219

* cited by examiner

Primary Examiner—David Nelms
Assistant Examiner—Thong Le
(74) Attorney, Agent, or Firm—Marger Johnson & McCollom, P.C.

(57) ABSTRACT

It is disclosed a semiconductor memory device and data output buffer thereof in which an area of a layout can be optimized. The semiconductor memory device includes a plurality of memory cell array blocks, a plurality of sense amplifiers arranged above (or below) the plurality of the memory cell array blocks for amplifying and outputting data outputted from each of the plurality of the memory cell array blocks, a plurality of first registers arranged adjacent each of the plurality of the sense amplifiers for storing a pair of sense output signals outputted from each of the plurality of the sense amplifiers and generating a first data output signal, a plurality of second registers arranged respectively below (or above) the plurality of the memory cell array blocks for receiving the first data output signal outputted from each of the plurality of the first registers in response to the clock control signal and an output enable signal and generating a pair of second data output signals, a plurality of output drivers arranged respectively below (or above) the plurality of the memory cell array blocks for driving the second data output signal pair outputted from the plurality of the second registers, and a plurality of input/output pads connected to each of the plurality of the output drivers.

16 Claims, 5 Drawing Sheets

SEMICONDUCTOR MEMORY DEVICE AND DATA OUTPUT BUFFER THEREOF

FIELD OF THE INVENTION

The present invention relates to a semiconductor memory device, and more particularly to a semiconductor memory device and a data output buffer thereof in which its layout area can be optimized.

DESCRIPTION OF THE PRIOR ART

In a conventional semiconductor memory device, input/output pads and the surrounding circuits are arranged centering around memory cell array blocks. Input/output pads and output drivers are typically arranged at the top and data output buffers are separately arranged at the bottom of each memory cell array block, with two signal lines connected from a data output buffer to an output driver and extending therebetween from top to bottom. Such an arrangement is inefficient in terms of layout because the two signal lines must pass between adjacent memory cell array blocks.

Figure 1:
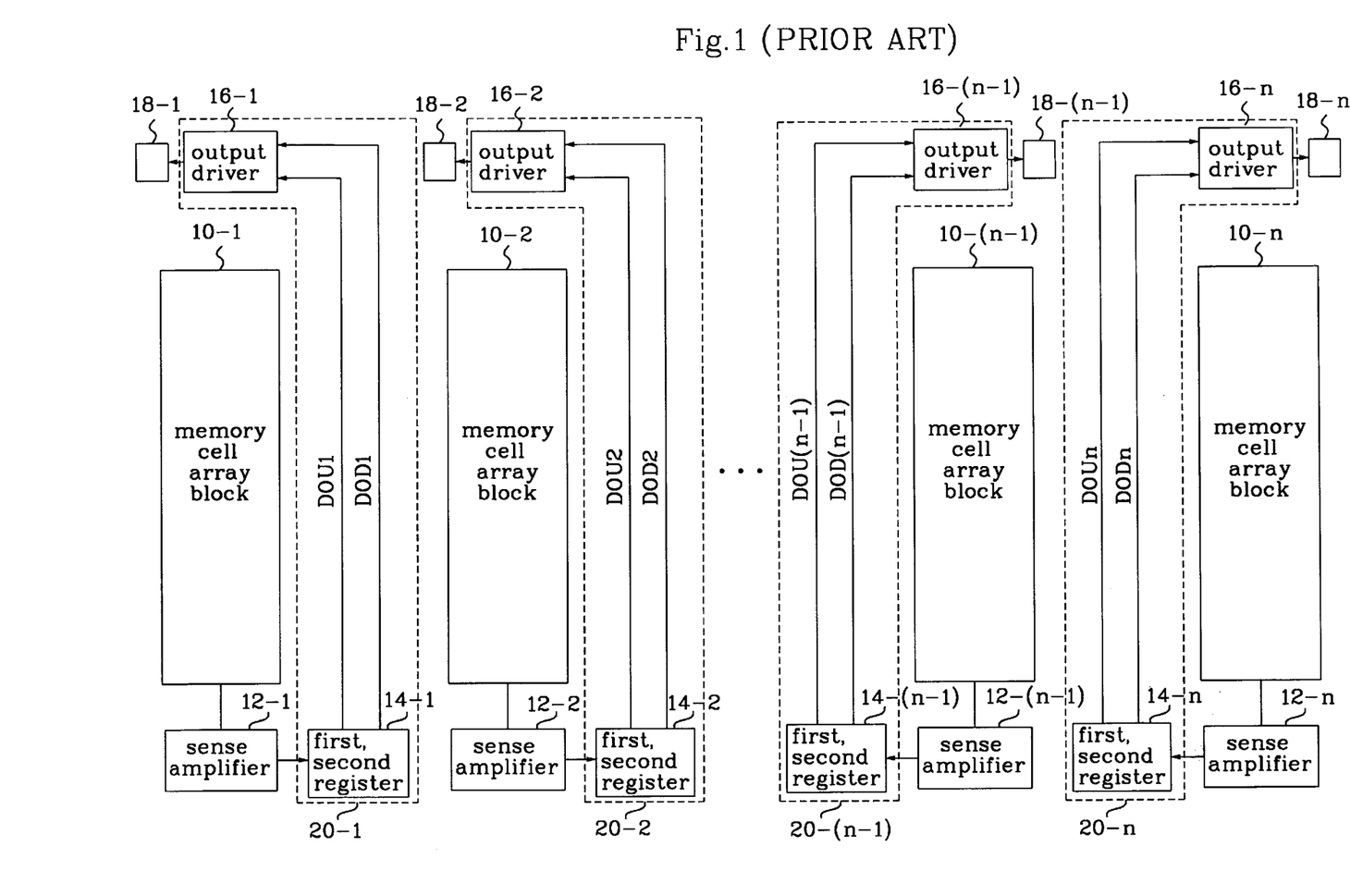
FIG. 1 is a block diagram illustrating a layout of a conventional semiconductor memory device.

FIG. 1 is a block diagram showing a layout of the conventional semiconductor memory device, comprising memory cell array blocks 10-1, 10-2, . . . , 10-(n-1), 10-n, sense amplifiers 12-1, 12-2, . . . , 12-(n-1), 12-n, data output buffers 20-1, 20-2, . . . , 20-(n-1), 20-n consisting of first and second registers 14-1, 14-2, . . . , 14-(n-1), 14-n, and output drivers 16-1, 16-2, . . . , 16-(n-1), 16-n, and input/output pads 18-1, 18-2, . . . , 18-(n-1), 18-n.

The conventional semiconductor memory device layout shown in FIG. 1 will be described in further detail.

It may be seen that the memory cell array blocks 10-1, 10-2, . . . , 10-(n-1), 10-n are arranged in the device's center, top-to-bottom, with the sense amplifiers 12-1, 12-2, . . . , 12-(n-1), 12-n and first and second registers 14-1, 14-2, . . . , 14-(n-1), 14-n arranged below the memory cell array blocks, with input/output pads 18-1, 18-2, . . . , 18-(n-1), 18-n and output drivers 16-1, 16-2, . . . , 16-(n-1), 16-n arranged above the memory cell array blocks, and with data line pairs DOU, DOD arranged between the laterally adjacent memory cell array blocks.

As shown in FIG. 1, in order to minimize the length of the signal line between the sense amplifiers 12-1, 12-2, . . . , 12-(n-l), 12-n and the first and second registers 14-1, 14-2, . . . , 14-(n-1), 14-n and the length of the signal line between the input/output pads 18-1, 18-2, . . . , 18-(n-1), 18-n and the output drivers 16-1, 16-2, . . . , 16-(n-1), 16-n, the first and second registers 14-1, 14-2, . . . , 14-(n-1), 14-n are arranged adjacent to the sense amplifiers 12-1, 12-2, . . . , 12-(n-1), 12-n and the output drivers 16-1, 16-2, . . . , 16-(n-1), 16-n are arranged adjacent to the input/output pads 18-1, 18-2, . . . , 18-(n-1), 18-n. Of course, it is preferable that the first and second registers 14-1, 14-2, . . . , 14-(n-1), 14-n are arranged adjacent to the output drivers 16-1, 16-2, . . . , 16-(n-1), 16-n. However, the output drivers 16-1, 16-2, . . . , 16-(n-1), 16-n are arranged adjacent to the input/output pads 18-1, 18-2,..., 18-(n-1), 18-n because the additional resistance/capacitance between the output drivers 16-1, 16-2, . . . , 16-(n-1), 16-n and the pads 18-1, 18-2, . . . , 18-(n-1), 18-n exerts a worse influence upon an operational speed of the semiconductor memory device than that between the first and second registers 14-1, 14-2, . . . , 14-(n-1), 14-n and the output drivers 16-1, 16-2, . . . , 16-(n-1), 16-n.

Thus, the layout shown in FIG. 1 is typical of the layout of a semiconductor memory device.

Figure 2:
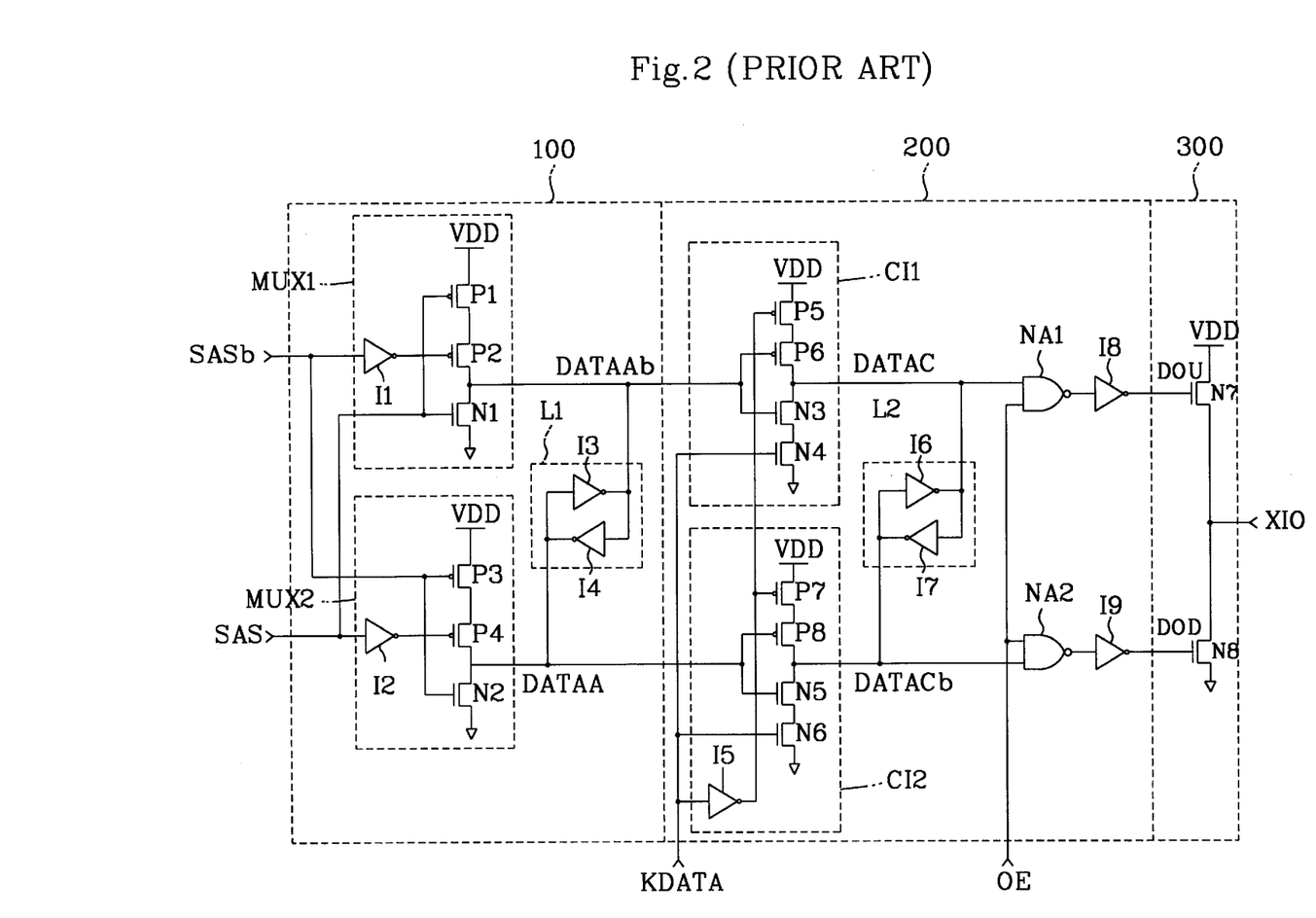
FIG. 2 is a circuit diagram illustrating an embodiment of a data output buffer of the semiconductor memory device shown in FIG. 1.

FIG. 2 is a circuit diagram of a data output buffer of the conventional semiconductor memory device, comprising first and second registers 100, 200 and an output driver 300. The reference numerals of the first and second registers 100, 200 and driver 300 are different from those of the corresponding registers and driver of FIG. 1.

The first register 100 comprises a multiplexer MUX1 including PMOS transistors P1, P2 and NMOS transistor N1; a multiplexer MUX2 including PMOS transistors P3, P4 and NMOS transistor N2; and a latch L1 including inverters I3, I4. The register 200 comprises a clocked CMOS inverter CI1 including PMOS transistors P5, P6 and NMOS transistors N3, N4; a clocked CMOS inverter CI2 including inverter I5, PMOS transistors P7, P8 and NMOS transistors N5, N6; a latch L2 including inverters I6, I7; and NAND gates NA1, NA2. The output driver 300 comprises NMOS transistors N7, N8.

The operation of the circuit shown in FIG. 2 will be described in further detail.

The register 100 receives sense a pair of complementary output signals SASb, SAS from the sense amplifier and generates a pair of data output signals DATAAb, DATAA to latch the data. The multiplexers MUX1, MUX2 allow the PMOS transistors P1, P2 and NMOS transistor N2 to be turned-on in response to the sense output signal pair SASb, SAS of "high" level and "low" level to thereby generate the data output signal pair DATAAb, DATAA of "high" level and "low" level. Also, the multiplexers MUX1, MUX2 allow the NMOS transistor N1 and PMOS transistors P3, P4 to be turned-on in response to the sense output signal pair SASb, SAS of "low" level and "high" level, thereby generating the data output signal pair DATAAb, DATAA of "low" level and "high" level. The latch L1 latches the data output signal pair DATAAb, DATAA to output them.

The register 200 receives a pair of data output signals DATAAb, DATAA to invert them in response to a clock control signal KDATA of "high" level and generates a pair of data output signals DATAC, DATACb to latch the data.

The clocked CMOS inverters CI1, CI2 serve to turn on the PMOS transistors P5, P7 and NMOS transistors N4, N6 in response to the clock control signal KDATA of "high" level. When the data output signal pair DATAAb, DATAA of "high" level and "low" level are input, the NMOS transistor N3 and PMOS transistor P8 are turned-on, thereby generating the data output signal pair DATAC, DATACb of "low" level and "high" level. Alternatively, when the data output signal pair DATAAb, DATAA of "low" level and "high" level are input, the PMOS transistor P6 and NMOS transistor N5 are turned-on, thereby generating the data output signal pair DATAC, DATACb of "high" level and "low" level. The latch having the inverters I6, I7 latches the data output signal pair DATAC, DATACb. The NAND gates NA1, NA2 and inverters I8, I9 generate the data output signal pair DATAC, DATACb as a pair of data output signals DOU, DOD in response to an output enable signal OE of "high" level. The NAND gates NA1, NA2 and inverters I8, I9 also generate the data output signal pair DOU, DOD of "low" level in response to the output enable signal OE of "low" level.

The output driver 300 allows the NMOS transistor N7 to be turned-on in response to the data output signal pair DOU, DOD of "high" level and "low" level to generate an output signal XI0 of "high" level. The output driver 300 alternatively allows the NMOS transistor N8 to be turned-on in response to the data output signal pair DOU, DOD of "low" level and "high" level to generate an output signal XI0 of "low" level.

Figure 3:
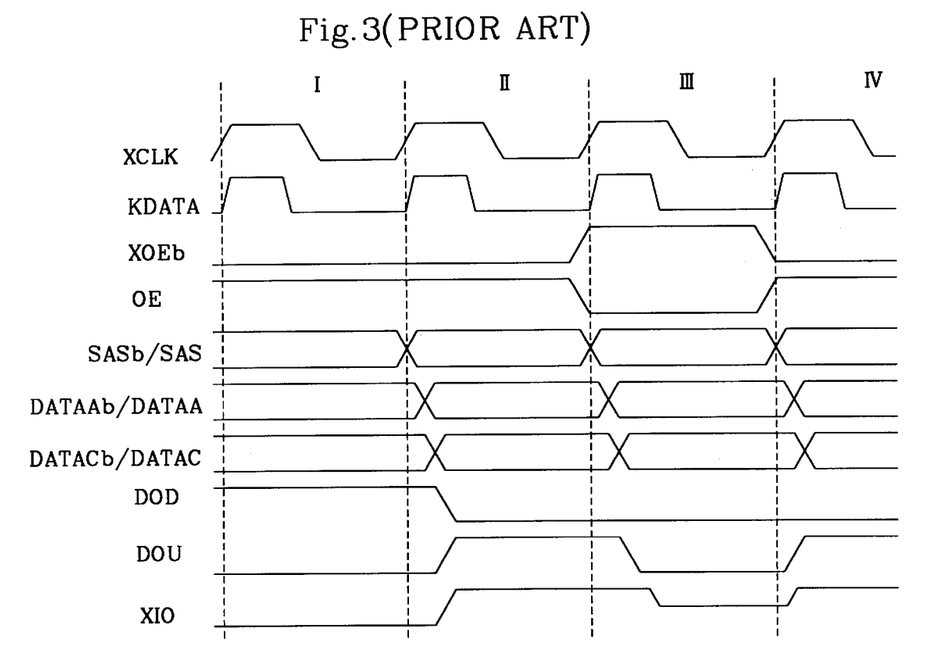
FIG. 3 is a timing diagram illustrating an operation of the data output buffer shown in FIG. 2.

FIG. 3 is a timing diagram illustrating the operation of the data output buffer shown in FIG. 2. If the clock signal XCLK is input into the semiconductor memory device, the clock control signal is generated. And, during the first, second fourth read command cycles I, II, IV, if an inversion data output enable signal XOEb of "low" level for outputting data is input into the semiconductor memory device, the signal is inverted and buffered, thereby generating a data output enable signal OE of "high" level. Then, the data output buffer is operated to generate the data output signal XIO.

During the first cycle I, the first register 100 of the data output buffer receives a pair of sense output signals SASb, SAS of "high" level and "low" level from the sense amplifier to thereby generate the data output signal pair DATAAb, DATAA of "high" level and "low" level. And the register 200 inverts the data output signal pair DATAAb, DATAA of "high" level and "low" level in response to a "high" level clock control signal KDATA to thereby generate the data output signal pair DATAC, DATACb of "low" level and "high" level. And the register 200 also generates the data output signal pair DOU, DOD of "low" level and "high" level in response to a "high"level of the output enable signal OE. And the output driver 300 operates the data output signal pair DOU, DOD of "low" level and "high" level to generate a "low" level of the output data signal XIO.

During the second and fourth cycles II, IV, the first register 100 of the data output buffer receives a pair of sense output signals SASb, SAS of "low" level and "high" level from the sense amplifier to thereby generate the data output signal pair DATAAb, DATAA of "low" level and "high" level. And the register 200 inverts the data output signal pair DATAAb, DATAA of "low" level and "high" level in response to a "high" level clock control signal KDATA to thereby generate the data output signal pair DATAC, DATACb of "high" level and "low" level. And the register 200 also generates the data output signal pair DOU, DOD of "high" level and "low" level in response to a "high" level of the output enable signal OE. And the output driver 300 operates the data output signal pair DOU, DOD of "high" level and "low" level to generate a "high" level of the output data signal XIO.

During the third cycle III, since the output enable signal OE is a "low" level, the data output signal pair DOU, DOD both become "low" levels, indicating that the output data signal XIO is in a state of high impedance.

Referring briefly back to FIG. 2, it may be understood that the output drivers are arranged above the memory cell array, the data output buffers are arranged below the memory cell array, and two signal lines DOUi and DODi (i=1–n) are arranged between the blocks of the memory cell array, like in FIG. 1. However, there has been a problem in that such arrangements produce relatively inefficient layouts because of the requirement to route the two data lines between laterally adjacent memory cells.

And, since the signal lines between the data output buffer and the pad is long, there has been a problem in that it takes a lot of time until the clock control signal KDATA is generated and outputted through the input/output pads. That is, there is an undesirably long time lapse from the generation of the clock signal XCLK to the generation of the data output signal XIO.

SUMMARY OF THE INVENTION

Accordingly, the present invention is provided to solve the aforementioned problems and it is an object of the present invention to provide a semiconductor memory device in which an area of a layout can be optimized.

It is another object of the present invention to provide a data output buffer of a semiconductor memory device in which an area of a layout can be optimized by simplifying a circuit design.

In accordance with the object of the present invention, a semiconductor memory device comprises: a plurality of memory cell array blocks; a plurality of sense amplifiers arranged above (or below) the plurality of the memory cell array blocks for amplifying and outputting data outputted from each of the plurality of the memory cell array blocks; a plurality of first registers arranged adjacent to each of the plurality of the sense amplifiers for storing a pair of sense output signals outputted from each of the plurality of the sense amplifiers and generating a first data output signal; a plurality of second registers arranged above (or below) the plurality of the memory cell array blocks for receiving the first data output signal outputted from each of the plurality of the first registers in response to the clock control signal and an output enable signal and generating a pair of second data output signals; a plurality of output drivers arranged below (or above) the plurality of the memory cell array blocks for driving the second data output signal pair outputted from the plurality of the second registers; and a plurality of input/output pads connected to the plurality of the output drivers.

In accordance with the another object of the present invention, a data output buffer of the semiconductor memory device comprises a first register for storing a pair of data input signals and generating a first data output signal; a second register for receiving the first data output signal outputting from the first register in response to a clock control signal and an output enable signal to generate a pair of a second data output signal, and an output driver for driving the second data output signal pair from the second register.

BRIEF DESCRIPTION OF THE DRAWINGS

For more complete understanding of the nature and object of the invention, reference will be made in the following detailed description taken in conjunction with the accompanying drawings in which.

DETAILED DESCRIPTION OF THE PREFERRED EMBODIMENTS

The preferred embodiments of the semiconductor memory device and data output buffer thereof of the present invention will now be described in detail with reference to the accompanying drawings.

Throughout the drawings, like reference numerals and nomenclature are used for designation of like or equivalent parts or portions for simplicity of illustration and explanation, unnecessary detailed description of which will be omitted.

Figure 4:
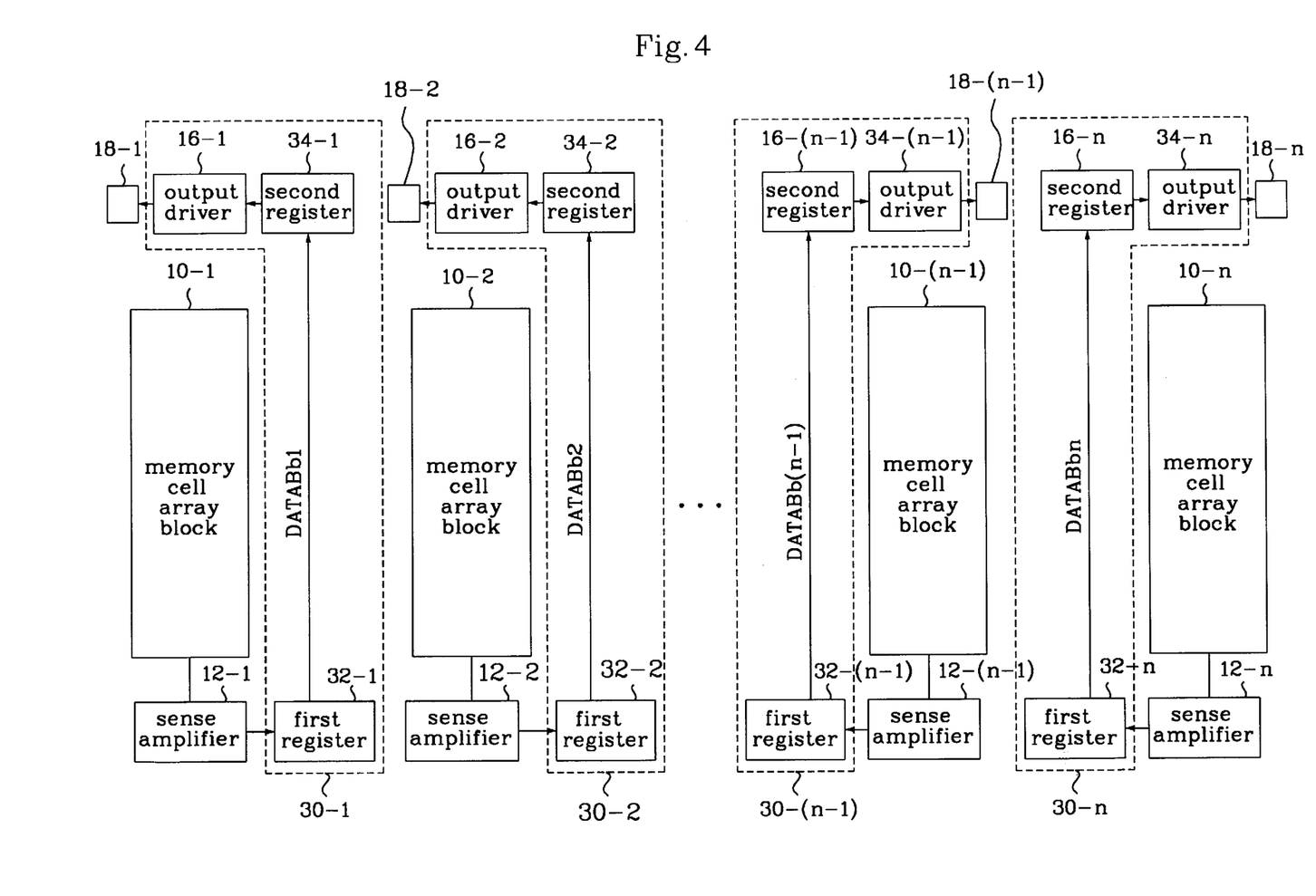
FIG. 4 is a block diagram showing a layout of the semiconductor memory device according to the present invention.

FIG. 4 is a block diagram showing a layout of the semiconductor memory device of the present invention. The structure and arrangements of the memory cell array blocks 10-1, 10-2, ..., 10(n-1), 10-n; sense amplifiers 12-1, 12-2, ..., 12-(n-1), 12-n; output drivers 16-1, 16-2, ..., 16-(n-1), 16-n; and pads 18-1, 18-2, ..., 18-(n-1), 18-n are identical to those of the conventional semiconductor memory device shown in FIG. 1. However, the first registers 32-1, 32-2, ..., 32-(n-1), 32-n and second registers 34-1, 34-2, ..., 34-(n-1), 34-n which make up the data output buffers 30-1, 30-2, ..., 30-(n-1), 30-n are different in structure and arrangement from those of the conventional semiconductor memory device shown in FIG. 1. They differ in that the first registers 32-1, 32-2, ..., 32-(n-1), 32-n are arranged adjacent to the sense amplifiers 12-1, 12-2, ..., 12-(n-1), 12-n while the second registers 34-1, 34-2, ..., 34-(n-1), 34-n are arranged adjacent to the output drivers 16-1, 16-2, ..., 16-(n-1), 16-n, and only one signal line extends for each memory cell array block from the first registers 32-1, 32-2, 32-(n-1), 32-n to the second registers 34-1, 34-2, ..., 43-(n-1), 34-n.

In the semiconductor memory device of the present invention shown in FIG. 4, the second registers are relocated nearer the output driver sides, and only one signal line need extend from top to bottom between the first and second registers and between the laterally adjacent array blocks, thereby increasing the efficiency of the layout.

Figure 5:
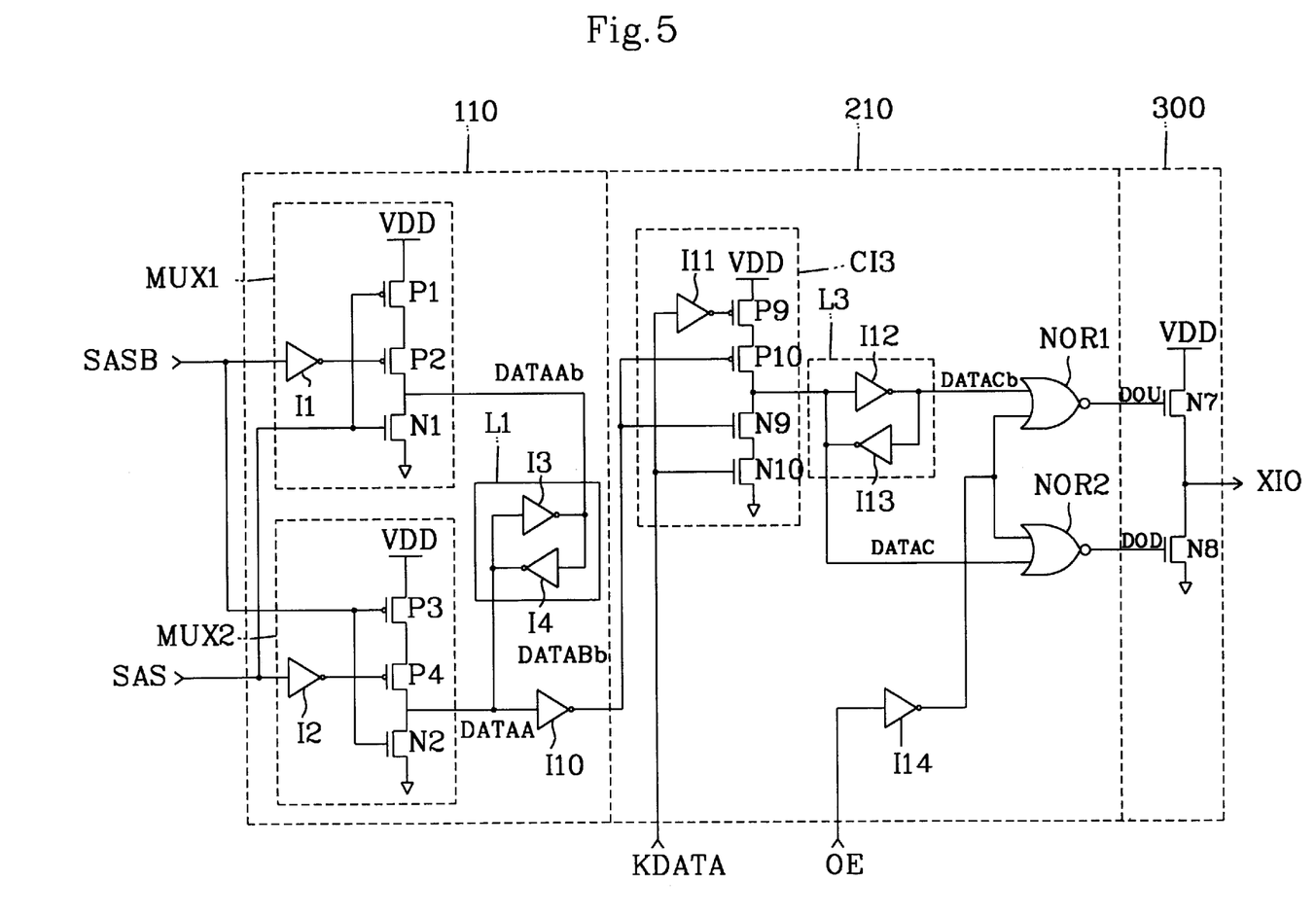
FIG. 5 is a circuit diagram for illustrating an embodiment of a data output buffer of the semiconductor memory device shown in FIG. 4.

FIG. 5 is a circuit diagram illustrating an embodiment of the data output buffer of the semiconductor memory device according to the present invention, comprising a first register 110, a second register 210, and an output driver 300.

The first register 110 has an additional inverter I10 not found in the conventional first register 100 shown in FIG. 2. The construction of the first register 110 may be understood as follows.

The multiplexer MUX1 includes an inverter I1 for inverting the inversion sense output signal SASB; two PMOS transistors P1, P2 which are connected in series between the internal power voltage VDD and the inversion data output signal DATAAb generating line to be controlled by the sense output signal SAS and output signal of the inverter I1; and an NMOS transistor N1 connected between the inversion data output signal DATAAb generating line and the ground voltage and controlled by the sense output signal SAS.

The multiplexer MUX2 comprises an inverter I2 for inverting the sense output signal SAS; two PMOS transistors P3, P4 which are connected in series between the internal power voltage VDD and the data output signal DATAA generating line to be controlled by the sense output signal SAS and output signal of the inverter I2; and an NMOS transistor N2 connected between the data output signal DATAA generating line and the ground voltage and controlled by the inversion sense output signal SASB. The latch L1 includes an inverter I3 for inverting a signal outputted from the data output signal DATAA generating line to transmit it to the inversion data output signal DATAAb generating line, and an inverter I4 for inverting a signal outputted from the inversion data output signal DATAAb generating line to transmit it to the data output signal DATAA generating line.

The second register 210 comprises a clocked CMOS inverter CI3 having an inverter I11; PMOS transistors P9, P10 and NMOS transistors N9, N10; a latch L3 including inverters I12, I13; an inverter I14; and NOR gates NOR1, NOR2.

The CMOS inverter CI3 comprises an inverter I11 for inverting the clock control signal KDATA; two PMOS transistors P9, P10 and two NMOS transistors N9, N10 all of which are connected in a series between the internal power voltage VDD and the ground voltage to be respectively controlled by the output signal of the inverter I11, the data output signal DATABb and the clock control signal KDATA.

The latch L3 consists of an inverter I12 for inverting the output signal of the clocked CMOS inverter CI3 to generate the inversion data output signal DATACb, and an inverter I13 connected to an input terminal of the inverter I12 to invert the output signal of the inverter I12 to thereby generate the data output signal DATAC.

The inverter I14 inverts the output enable signal OE, and the NOR gates NOR1, NOR2 perform NORing of the output signal of the inverter I14 and the data output signal pair DATACb, DATAC to thereby generate the data output signal pair DOU, DOD.

The output driver 300 consists of NMOS transistors N7, N8 which are connected in a series between the power voltage and the ground voltage and which are controlled by the data output signal pair DOU, DOD.

The operation of the circuit shown in FIG. 5 may be understood as follows.

The first register 110 receives the sense output signal pair SASb, SAS to generate the data output signal pair DATAAb, DATAA and latches it. The operation of the first register 110 will be further understood referring to the operation of the first register 100 shown in FIG. 2. The inverter I10 inverts the data output signal DATAA to thereby generate the data output signal DATABb. That is, the data output signal DATABb is transmitted between the blocks of the memory cell array as in FIG. 4.

The second register 210 receives the data output signal DATABb outputted from the first register 110 to generate the second data output signal pair DATACb, DATAC in response to the clock control signal KDATA of a "high" level, and to generate the data output signal pair DOU, DOD in response to the output enable signal OE.

In the clocked CMOS inverter CI3, the PMOS transistor P9 and NMOS transistor N10 are turned-on in response to the clock control signal of a "high" level, thereby inverting the data output signal DATABb of "high" level to output a low level of signal, and inverting the data output signal DATABb of "low" level to generate a "high" level of signal. The inverter I14 inverts the output enable signal OE. The NOR gates NOR1, NOR2 invert the data output signal pair DATACb, DATAC to generate the data output signal pair DOU, DOD in response to a "low" level output of the inverter I14, and to generate the high-impedance state of data output signal pair DOD, DOU of "low" level in response to a "high" level of output signal of the inverter I14.

The operation of the output driver 300 will be further understood referring to the operation of the data output buffer shown in FIG. 2.

The data output buffer shown in FIG. 5 is has a simplified circuit structure compared with the conventional data output buffer shown in FIG. 2. Therefore, the semiconductor memory device and data output buffer therein increase layout efficiency.

Figure 6:
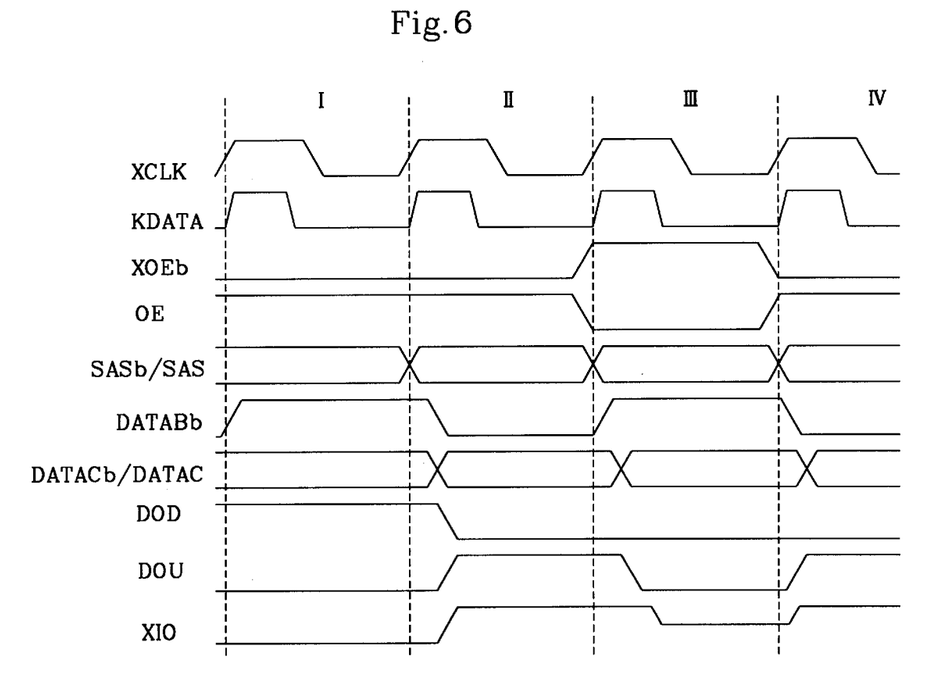
FIG. 6 is a timing diagram for illustrating an operation of the data output buffer shown in FIG. 5.

FIG. 6 is a timing diagram for illustrating an operation of the data output buffer shown in FIG. 5, and will be used in an explanation of the circuit shown in FIG. 5 as follows.

As explained in the timing diagram of FIG. 3, when the clock signal XCLK is input into the semiconductor memory device, the clock control signal KDATA is generated. In the first, second, fourth read command cycles I, II, IV, when the inversion data output enable signal XOEb of "low" level for outputting data is input into the semiconductor memory device, the signal is inverted and buffered, thereafter the data output enable signal OE of "high" level is generated. Then, the data output buffer is operated to generate the data output signal XIO.

In the first cycle I, the first register 110 of the data output buffer receives the sense output signal pair SASb, SAS of "high" level and "low" level from the sense amplifier to generate the data output signal pair DATAAb, DATAA of "high" level and "low" level. The inverter I10 therein inverts the data output signal DATAA of "low" level to generate the data output signal DATABb of "high" level. The second register 210 generates the data output signal pair DATACb, DATAC of "high" level and "low" level in response to the clock control signal KDATA of "high" level, and the data output signal pair DOU, DOD of "low" level and "high" level in response to the output enable signal OE of "high" level, respectively. And, the output driver 300 drives the data output signal pair DOU, DOD of "low" level and "high" level to generate the output data signal XIO of "low" level.

In the second and fourth cycles II, IV, the first register 110 of the data output buffer receives the sense output signal pair SASb, SAS of "low" level and "high" level from the sense amplifier to generate the data output signal pair DATAAb, DATAA of "low" level and "high" level. The inverter I10 therein inverts the data output signal DATAA of "high" level to generate the data output signal DATABb of "low" level. The second register 210 generates the data output signal pair DATACb, DATAC of "low" level and "high" level in response to the clock control signal KDATA of "high" level, and the data output signal pair DOU, DOD of "high" level and "low" level in response to the output enable signal OE of "high" level, respectively. And, the output driver 300 drives the data output signal pair DOU, DOD of "high" level and "low" level to generate the output data signal XIO of "high" level.

In the third cycle III, since the output enable signal OE is at a "low" level, all the data output signal pair DOU, DOD become "low" level. As a result, the output data signal XIO is in a state of high impedance. That is, the data output buffer of the semiconductor memory device shown in FIG. 5 requires only one line of the data output signal DATABb routed between the first register and the second register.

Therefore, the semiconductor memory device of the present invention is circuit designed and layout configured in such a way that one signal line only is passed between adjacent blocks of the memory cell array, thereby increasing the efficiency of the layout.

And, the data output buffer of the semiconductor memory device of the present invention is constructed in such a manner that the first register is arranged adjacent the sense amplifier and the second register is arranged adjacent the output driver, thereby reducing a signal delay from the generation of the clock signal to the generation of the data output signal XIO. Accordingly, a semiconductor memory device in accordance with the invention may be operated reliably at higher speeds than with conventional designs and layouts.

In addition, the data output buffer of the semiconductor memory device of the present invention has a simple circuit structure so that the layout can be efficiently performed therein.

What is claimed is:

1. A semiconductor memory device comprises:
   a plurality of memory cell array blocks;
   a plurality of sense amplifiers arranged above or below the plurality of the memory cell array blocks for amplifying and outputting data outputted from each of the plurality of the memory cell array blocks;
   a plurality of first registers arranged adjacent each of the plurality of the sense amplifiers for storing a pair of sense output signals outputted from each of the plurality of the sense amplifiers and generating a first data output signal;
   a plurality of second registers arranged respectively below or above the plurality of the memory cell array blocks for receiving the first data output signal outputted from each of the plurality of the first registers in response to the clock control signal and an output enable signal and generating a pair of second data output signals;
   a plurality of output drivers arranged respectively below or above the plurality of the memory cell array blocks for driving the second data output signal pair outputted from the plurality of the second registers; and
   a plurality of input/output pads connected to each of the plurality of the output drivers.

2. The device as defined in claim 1, wherein each of the plurality of the first registers comprises:
   first and second multiplexers for receiving the sense output signal pair and generating a pair of third data output signals;
   a first latch connected between the third data output signal pair outputted from the first and second multiplexers to latch the third data output signal pair; and
   a first inverter for inverting one of the third data output signal pair to generate the first data output signal.

3. The device as defined in claim 2, wherein the first multiplexer comprises:
   a second inverter for inverting an inversion sense output signal of the output signal pair;
   first and second PMOS transistors being connected in series between an internal power voltage and the inverted first data output signal generating line to be controlled by the sense output signal and an output signal of the second inverter; and
   a NMOS transistor being connected between the inverted first data output signal generating line and a ground voltage to be controlled by the sense output signal.

4. The device as defined in claim 2, wherein the second multiplexer comprises:
   a third inverter for inverting one of the sense output signal pair;
   third and fourth PMOS transistors being connected in series between the internal power voltage and the first data output signal generating line to be controlled by the inverted sense output signal and an output signal of the third inverter; and
   a second NMOS transistor being connected between the first data output signal generating line and the ground voltage to be controlled by the inversion sense output signal.

5. The device as defined in claim 1, wherein the second register comprises:
   a clocked CMOS inverter for inverting the output signal of the first inverter in response to the clock control signal to output it;

a second latch for inverting and latching the output signal of the clocked CMOS inverter to generate a fourth data output signal pair; and logic gates for inverting the fourth data output signal pair outputted from the second latch to generate as a second data output signal pair in response to the output enable signal.

6. The device as defined in claim 5, wherein the clocked CMOS inverter comprises:

a sixth inverter for inverting the clock control signal;

fifth, sixth PMOS transistors and third, fourth NMOS transistor which are connected in a series between the internal power voltage and the ground voltage to be respectively controlled by an output signal of the sixth inverter, an output signal of the first inverter, a clock control signal, thereby inverting the output signal of the first inverter to output it.

7. The device as defined in claim 5, wherein the logic gate comprises:

a ninth inverter for inverting the output enable signal;

a first NOR gate for NORing the inverted fourth data output signal and the output signal of the ninth inverter to generate the second data output signal; and a second NOR gate for NORing the fourth data output signal and the output signal of the ninth inverter to generate the inverted second data output signal.

8. A data output buffer of a semiconductor memory device comprises:

a first register for storing a pair of data input signals and generating a first data output signal;

a second register for receiving the first data output signal outputted from the first register in response to a clock control signal and an output enable signal to generate a second complementary data output signal pair; and an output driver for driving the second complementary data output signal pair outputted from the second register.

9. The data output buffer as defined in claim 8, wherein the first register comprises:

first and second multiplexers for receiving the data input signal pair to generate a pair of third data output signals;

a first latch connected between the third data output signal pair outputted from the first and second multiplexers to latch the third data output signal pair; and a first inverter for inverting one of the third data output signal pair to generate the first data output signal.

10. The data output buffer as defined in claim 9, wherein the first multiplexer comprises:

a second inverter for inverting an inversion data input signal of the data input signal pair;

first and second PMOS transistors being connected in series between an internal power voltage and the inversion third data output signal generating line to be controlled by the data input signal and an output signal of the second inverter; and a first NMOS transistor being connected between the inversion third data output signal generating line and a ground voltage to be controlled by the data input signal.

11. The data output buffer as defined in claim 9, wherein the second multiplexer comprises:

a third inverter for inverting one of the data input signal pair;

third and fourth PMOS transistors being connected in series between the internal power voltage and the third data output signal generating line to be controlled by the inversion data input signal and an output signal of the third inverter; and a second NMOS transistor being connected between the third data output signal generating line and the ground voltage to be controlled by the inversion data input signal.

12. The data output buffer as defined in claim 8, wherein the second register comprises:

a clocked CMOS inverter for inverting the output signal of the first inverter in response to the clock control signal to output it;

a second latch for inverting and latching the output signal of the clocked CMOS inverter to generate a fourth data output signal pair; and logic gates for inverting the fourth data output signal pair outputted from the second latch to generate as a second data output signal pair in response to the output enable signal.

13. The data output buffer as defined in claim 12, wherein the logic gate comprises:

a ninth inverter for inverting the output enable signal;

a first NOR gate for NORing the inverted fourth data output signal and the output signal of the ninth inverter to generate the second data output signal; and a second NOR gate for NORing the fourth data output signal and the output signal of the ninth inverter to generate the inverted second data output signal.

14. The data output buffer as defined claim 1, wherein the CMOS inverter comprises:

a sixth inverter for inverting the clock control signal;

fifth, sixth PMOS transistors and third, fourth NMOS transistor which are connected in a series between the internal power voltage and the ground voltage to be respectively controlled by an output signal of the sixth inverter, an output signal of the first inverter, and a clock control signal, thereby inverting the output signal of the first inverter to output it.

15. A semiconductor memory device comprises:

a plurality of memory cell array blocks;

a plurality of first registers arranged above or below the plurality of the memory cell array blocks for storing a data output signal outputted from the plurality of memory cell array blocks and for generating a first data output signal;

a plurality of second registers arranged respectively below or above the plurality of the memory cell array blocks for receiving the data output signal outputted from each of the plurality of the first registers in response to the clock control signal and an output enable signal and generating a pair of second data output signals; and a plurality of output drivers arranged respectively below or above the plurality of the memory cell array blocks for driving the second data output signal pair outputted from the plurality of the second registers.

16. A semiconductor memory device comprising:

at least two adjacent memory cell array blocks arranged within the semiconductor memory device;

a sense amplifier corresponding with each memory cell array block for sensing a datum within the memory cell array block and for outputting the sensed datum;

a first register corresponding with each memory cell array block for storing a data output signal outputted from the corresponding memory cell array block via the corresponding sense amplifier and for generating a first single-rail data output signal representing the logic state of a datum within the memory cell array block, said first register being located near one end of the adjacent memory cell array blocks;

a second register corresponding with each memory cell array block for receiving the first data output signal outputted by a corresponding first register in response to a clock control signal and an output enable signal, said second register generating a second double-rail data output signal pair complementarily representing the logic state of the datum within the memory cell array block, said second register being located near an other end of the adjacent memory cell array blocks; and an output driver corresponding with each memory cell array block for driving the second double-rail data output signal pair onto an input/output line corresponding therewith, said output driver being located near the corresponding second register, whereby only one data signal extends between the at least two adjacent memory cell array blocks from the one end to the other end thereof.

* * * * *

UNITED STATES PATENT AND TRADEMARK OFFICE
CERTIFICATE OF CORRECTION

PATENT NO.     : 6,198,650 B1
DATED           : March 6, 2001
INVENTOR(S)  : Young-Ho Suh It is certified that error appears in the above-identified patent and that said Letters Patent is hereby corrected as shown below:

<u>Column 2,</u>
Line 9, "14" should be -- I4 --.

<u>Column 5,</u>
Line 66, "NORI" should be -- NOR1 --.

<u>Column 6,</u>
Line 3, "N1O" should be -- N10 --.

Signed and Sealed this

Twenty-sixth Day of November, 2002

Attest:

Attesting Officer

JAMES E. ROGAN
*Director of the United States Patent and Trademark Office*